United States Patent
Wu

(10) Patent No.: US 9,952,692 B2
(45) Date of Patent: Apr. 24, 2018

(54) SENSOR DEVICE AND METHOD OF FABRICATING THE SAME

(71) Applicant: National Tsing Hua University, Hsinchu (TW)

(72) Inventor: Jyh-Ming Wu, Hsinchu County (TW)

(73) Assignee: National Tsing Hua University, Hsinchu (TW)

( * ) Notice: Subject to any disclaimer, the term of this patent is extended or adjusted under 35 U.S.C. 154(b) by 96 days.

(21) Appl. No.: 15/081,804

(22) Filed: Mar. 25, 2016

(65) Prior Publication Data

US 2017/0228054 A1 Aug. 10, 2017

(30) Foreign Application Priority Data

Feb. 4, 2016 (TW) .............................. 105103883 A

(51) Int. Cl.
*G06F 3/041* (2006.01)
*H03K 17/96* (2006.01)

(52) U.S. Cl.
CPC .............. *G06F 3/041* (2013.01); *H03K 17/96* (2013.01); *G06F 2203/04102* (2013.01); *G06F 2203/04103* (2013.01); *G06F 2203/04104* (2013.01)

(58) Field of Classification Search
CPC ........... G06F 3/041; G06F 2203/04102; G06F 2203/04104; G06F 2203/04103; H03K 17/96
See application file for complete search history.

(56) References Cited

U.S. PATENT DOCUMENTS

2014/0313141 A1* 10/2014 Park ..................... G06F 1/1635
345/173
2017/0164806 A1* 6/2017 Calimano ............... A47L 13/16

FOREIGN PATENT DOCUMENTS

| CN | 103777803 | 5/2014 |
|---|---|---|
| TW | M488144 | 10/2014 |
| TW | M1499647 | 4/2015 |
| TW | 201516803 | 5/2015 |

OTHER PUBLICATIONS

"Office Action of Taiwan Counterpart Application", dated Nov. 14, 2016, p. 1-p. 5, in which the listed references were cited.
Zhang et al, "Contact Electrification Field-Effect Transistor," ACS Nano, Aug. 2014, pp. 8102-8709.
Ozel et al, "Polymer Electrolyte Gating of Carbon Nanotube Network Transistors," Nano Letters, Apr. 2005, pp. 905-911.

* cited by examiner

*Primary Examiner* — Charles Hicks
(74) *Attorney, Agent, or Firm* — J.C. Patents

(57) ABSTRACT

A sensor device and a method of fabricating the same are provided. The sensor device includes a substrate, a plurality of first electrodes, a plurality of second electrodes, a plurality of sensor units, and a contact layer. The first electrodes and the second electrodes are located on at least one of surfaces of the substrate. The first electrodes are arranged along a first direction and extended along a second direction, and the second electrodes are arranged along the second direction and extended along the first direction. A plurality of intersection regions are formed by a projection of the first electrodes and the second electrodes onto the substrate. The sensor units are electrically connected to each of the first electrodes and each of the second electrodes respectively. The contact layer is located on at least the first electrodes or the second electrodes.

15 Claims, 9 Drawing Sheets

SENSOR DEVICE AND METHOD OF FABRICATING THE SAME

CROSS-REFERENCE TO RELATED APPLICATION

This application claims the priority benefit of Taiwan application serial no. 105103883, filed on Feb. 4, 2016. The entirety of the above-mentioned patent application is hereby incorporated by reference herein and made a part of this specification.

BACKGROUND OF THE INVENTION

Field of the Invention

The invention relates to a sensor device and a method of fabricating the same, and particularly relates to a sensor device and a method of fabricating the same.

Description of Related Art

The interaction between technology and human is based on the interface design wherein how to input and output messages being the most important function. Human senses are derived from five kinds of perception, namely, based on: sight, hearing, taste, smell and touch, wherein the touch sense is the most direct perception source but also the most difficult to imitate.

The sensor device is used to transfer the received touch sense signal into the output of resistance or voltage to exhibit the touch sensing. However, conventional sensor devices usually need an external power source so that the sensor device can be operated normally. Thus, the application range thereof is limited. Therefore, if the sensor device can self-generated power without the external power source, the application range thereof can be extended.

SUMMARY OF THE INVENTION

The invention provides a sensor device and a method of fabricating the same, which can self-generated power by generating an induced charge, such that the advantages of flexibility, transparency, and a thin structure can be achieved. Additionally, more precise sensitivity can be achieved by the electrode arrangement in the sensor device.

The invention provides a sensor device. The sensor device includes a substrate, a plurality of first electrodes, a plurality of second electrodes, a plurality of sensor units, and a contact layer. The first electrodes and the second electrodes are located on at least one of surfaces of the substrate. The first electrodes are arranged along a first direction and extended along a second direction, and the second electrodes are arranged along the second direction and extended along the first direction. A plurality of intersection regions are formed by a projection of the first electrodes and the second electrodes onto the substrate. The sensor units are electrically connected to each of the first electrodes and each of the second electrodes respectively. The contact layer is located on at least the first electrodes or the second electrodes.

According to an embodiment of the invention, a thickness of the contact layer is less than 2 mm.

According to an embodiment of the invention, the substrate includes a flexible substrate, a hard glass substrate, a conductive substrate, a semiconductor substrate, a ceramic substrate, a metal oxide substrate, or a combination thereof.

According to an embodiment of the invention, each of materials of the first electrodes and the second electrodes includes metal, an alloy, or metal oxide.

According to an embodiment of the invention, the first electrodes and the second electrodes are located on the same surface of the substrate.

According to an embodiment of the invention, the sensor device further includes an insulating layer located between the first electrodes and the second electrodes.

According to an embodiment of the invention, the first electrodes and the second electrodes are located on different surfaces of the substrate respectively.

The invention also provides a method of fabricating a sensor device including the following steps. A substrate is provided. A plurality of first electrodes and a plurality of second electrodes are formed on at least one of surfaces of the substrate. The first electrodes are arranged along a first direction and extended along a second direction, and the second electrodes are arranged along the second direction and extended along the first direction. A plurality of intersection regions are formed by a projection of the first electrodes and the second electrodes onto the substrate. A plurality of sensor units electrically connected to each of the first electrodes and each of the second electrodes respectively are provided. A contact layer is formed on at least the first electrodes or the second electrodes.

According to an embodiment of the invention, a thickness of the contact layer is less than 2 mm.

According to an embodiment of the invention, the substrate includes a flexible substrate, a hard glass substrate, a conductive substrate, a semiconductor substrate, a ceramic substrate, a metal oxide substrate, or a combination thereof.

According to an embodiment of the invention, each of materials of the first electrodes and the second electrodes includes metal, an alloy, or metal oxide.

According to an embodiment of the invention, the first electrodes and the second electrodes are located on the same surface of the substrate.

According to an embodiment of the invention, the method further includes forming an insulating layer between the first electrodes and the second electrodes.

According to an embodiment of the invention, the first electrodes and the second electrodes are located on different surfaces of the substrate respectively.

Based on the above, the sensor device of the invention can be manufactured into a sensor device having flexibility, transparency, and a thin structure by the selection of suitable materials. Additionally, since the induced current or voltage is generated by a relative potential difference between the object and the contact layer of the sensor device of the invention, an external power source is not required. Also, a thickness of the sensor device of the invention is thinner compared to that of the conventional touch devices or touch keyboards. Moreover, the arrangement of the intersection regions are formed by the arrangement of a plurality of bar-shaped electrodes of the invention, such that the density of the electrode arrangement in a unit area is higher. Therefore, the sensor device of the invention can achieve more precise sensitivity.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
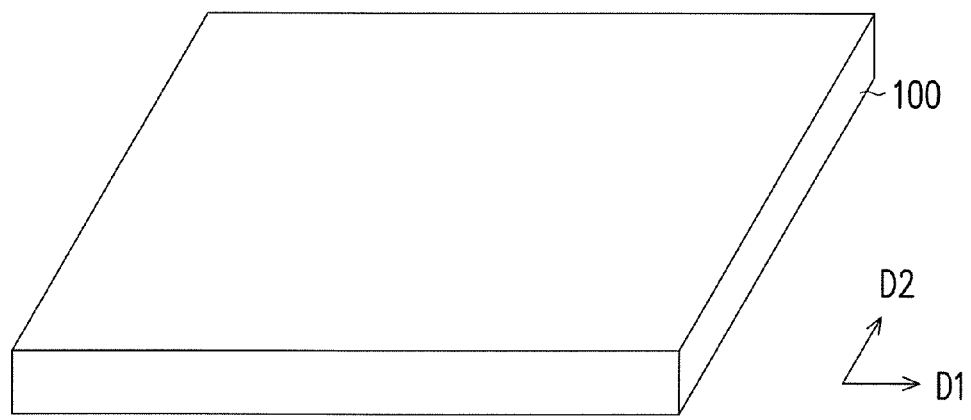
FIG. 1A to FIG. 1E are schematic three-dimensional structure diagrams illustrating a method of fabricating a sensor device according to an embodiment of the invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

FIG. 1A to FIG. 1E are schematic three-dimensional structure diagrams illustrating a method of fabricating a sensor device according to an embodiment of the invention. FIG. 2 is a schematic cross-sectional diagram illustrating the sensor device along the line A-A' of FIG. 1E.

Figure 2:
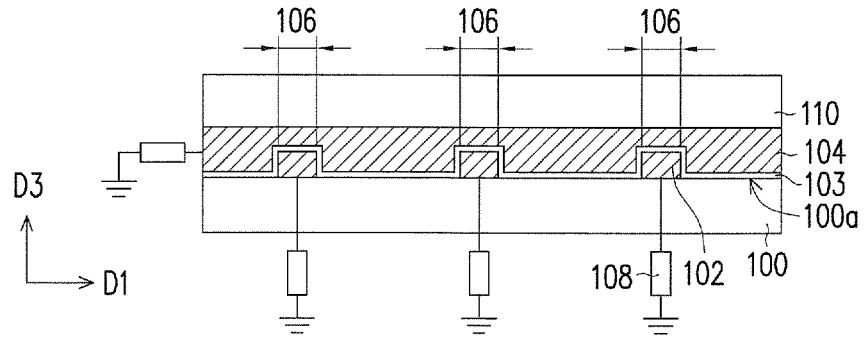
FIG. 2 is a schematic cross-sectional diagram illustrating the sensor device along the line A-A' of FIG. 1E.

Referring to FIG. 1A, a substrate 100 is provided. A material of the substrate 100 includes a flexible material or a hard material, such as polyethylene terephthalate (PET), glass, silicon, stainless steel, aluminum oxide ($Al_2O_3$), aluminum, polyimide (PI), polyethylene naphthalate (PEN), polydimethylsiloxane (PDMS), copper, plastic, polytetrafluoroethene (PTFE), or other material having flexibility. The flexible materials may be transparent or opaque. A thickness of the substrate 100 ranges from 1 μm to 5 mm, for example. In another embodiment, the thickness of the substrate 100 may range from 100 μm to 1 mm, for example. In an embodiment, the substrate 100 may be a flexible substrate, a hard glass substrate, a conductive substrate, a semiconductor substrate, a ceramic substrate, a metal oxide substrate, or a combination thereof, for example.

Figure 1B:
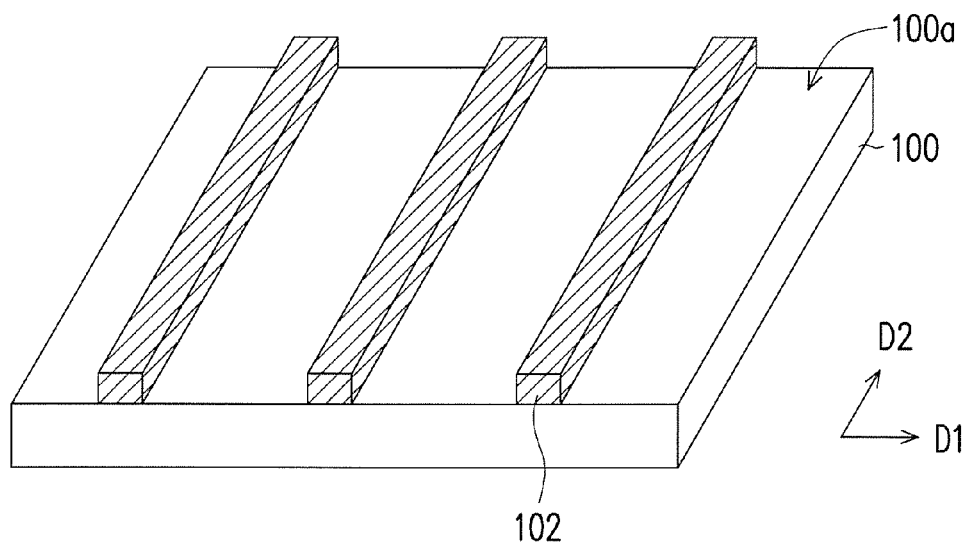
Figure 1C:
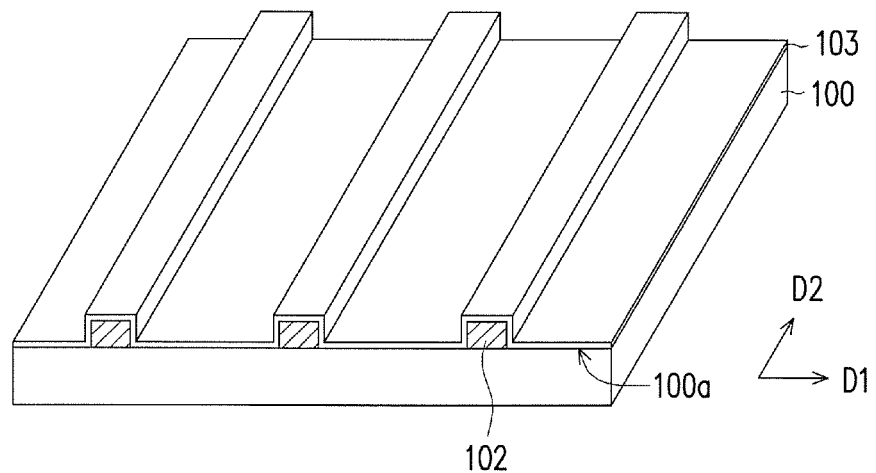
Figure 1D:
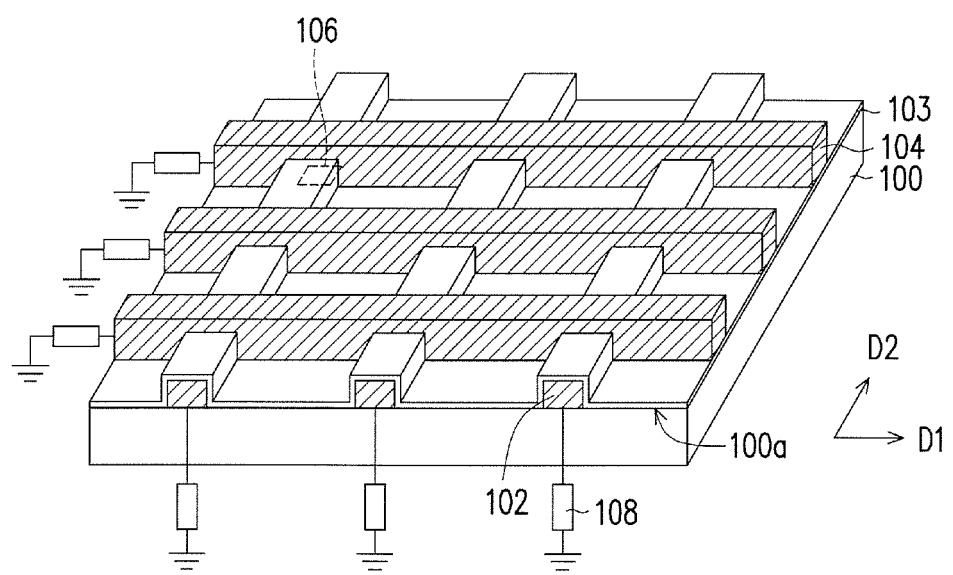

Referring to FIG. 1B to FIG. 1D, a plurality of first electrodes 102 and a plurality of second electrodes 104 located on at least one of surfaces of the substrate 100 is formed.

In the present embodiment, the first electrodes 102 and the second electrodes 104 are located on the same surface of the substrate 100. That is, both the first electrodes 102 and the second electrodes 104 are located on an upper surface 100a of the substrate 100. However, the present invention is not limited thereto.

In the present embodiment, as shown in FIG. 1B, the first electrodes 102 are formed on the upper surface 100a of the substrate 100 first, wherein the first electrodes 102 are arranged along a first direction D1 and the first electrodes 102 are extended along a second direction D2. Next, as shown in FIG. 1C, an insulating layer 103 covering the first electrodes 102 and the substrate 100 is formed. Then, as shown in FIG. 1D, the second electrodes 104 are formed on the insulating layer 103, wherein the second electrodes 104 are arranged along the second direction D2 and the second electrodes 104 are extended along the first direction D1. In the present embodiment, the insulating layer 103 is located between the first electrodes 102 and the second electrodes 104. That is, the first electrodes 102 are electrically isolated from the second electrodes 104 by the insulating layer 103.

In an embodiment, a plurality of intersection regions 106 are formed by a projection of the first electrodes 102 and the second electrodes 104 onto the substrate 100. In an embodiment, the arrangement of the projection of the first electrodes 102 and the second electrodes 104 onto the substrate 100 may be a mesh shape or a lattice shape. Each of shapes of the first electrodes 102 and the second electrodes 104 is a bar shape, for example. However, the present invention is not limited thereto. A width of each of the first electrodes 102 and a width of each of the second electrodes 104 respectively range from 10 nm to 100 mm, for example. A distance between two adjacent electrodes ranges from 10 nm to 100 mm, for example. A size of the intersection regions 106 formed by the projection of the first electrodes 102 and the second electrodes 104 onto the substrate 100 ranges from 10 nm to 100 mm, for example. However, the present invention is not limited thereto.

A method of forming the first electrodes 102, the second electrodes 104, and the insulating layer 103 is that, a first electrode material layer (not shown) is formed on the substrate 100 first, and then a patterning process is performed on the first electrode material layer so as to form the first electrodes 102 arranged along the first direction D1 and extended along the second direction D2. Next, the insulating layer 103 covering surfaces of the first electrodes 102 and the substrate 100 is formed. Then, after a second electrode material layer (not shown) is formed on the insulating layer 103, a patterning process is performed on the second electrode material layer so as to form the second electrodes 104 arranged along the second direction D2 and extended along the first direction D1.

Each of materials of the first electrodes 102 and the second electrodes 104 may be metal, an alloy, or metal oxide, and the metal is copper, aluminum, silver, or other metal with good conductivity, for example. The metal oxide may be a transparent conductive material, such as indium tin oxide, indium zinc oxide, aluminum tin oxide, aluminum zinc oxide, indium germanium zinc oxide, or other suitable oxides. However, the present invention is not limited thereto. A material of the insulating layer 103 is polydimethylsiloxane (PDMS), silicon oxide ($SiO_2$), or poly(methyl methacrylate) (PMMA), for example. A thickness of the insulating layer 103 ranges from 10 nm to 100 μm, for example.

Referring to FIG. 1D, a plurality of sensor units 108 electrically connected to each of first electrodes 102 and each of second electrodes 104 respectively are provided. The sensor units 108 can be used to express current or voltage through the first electrodes 102 and the second electrodes 104. The operation principle of the generation of induced current will be described below. Additionally, another end of the sensor units 108 is grounded to maintain electrical neutrality of the overall sensor device by input or output electrons in the process of generating the induced current.

Figure 1E:
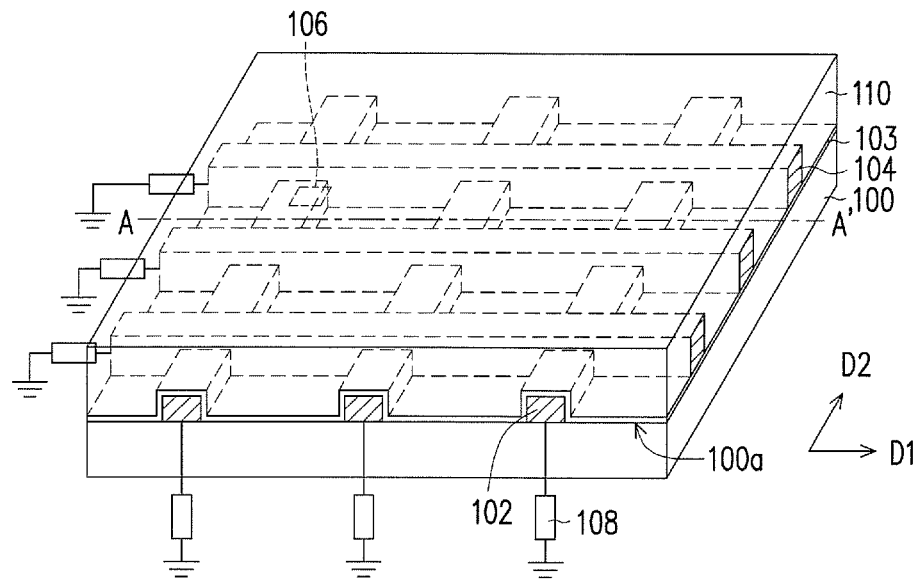

Referring to FIG. 1E, a contact layer 110 is formed on the insulating layer 103 and the second electrodes 104. Specifically, the contact layer 110 is blanketly formed on the upper surface 100a of the substrate 100, and the contact layer 110 covers the first electrodes 102, the insulating layer 103, and the second electrodes 104. A material of the contact layer 110 is that, the material has a relative potential difference from the object used to be in contact with the contact layer 110 described below. For example, the material of the contact layer 110 is polydimethylsiloxane (PDMS), polytetrafluoroethene (PTFE), silicon oxide ($SiO_2$), a metal thin film, nylon, or a combination thereof. However, the present invention is not limited thereto. The materials of the contact layer 110 may be the materials with flexibility and transparency.

Hereinafter, the structure of the sensor device of the invention is described with reference to FIG. 1E and FIG. 2.

As shown in FIG. 1E and FIG. 2, the sensor device of the invention includes the substrate 100, the first electrodes 102, the insulating layer 103, the second electrodes 104, the sensor units 108, and the contact layer 110. The first electrodes 102 and the second electrodes 104 are located on at least one of surfaces 100a of the substrate 100. The first electrodes 102 are arranged along the first direction D1 and extended along the second direction D2. The second electrodes 104 cross the first electrodes 102, and the second electrodes 104 are arranged along the second direction D2 and extended along the first direction D1. The insulating layer 103 is located on the first electrodes 102 and the substrate 100. The contact layer 110 is located on the insulating layer 103 and the second electrodes 104. On the other hand, as shown in FIG. 2, the insulating layer 103 is located between the first electrodes 102 and the second electrodes 104 to electrically isolate the first electrodes 102 from the second electrodes 104. The insulating layer 103 is also located between the substrate 100 and the second electrodes 104 to electrically isolate the substrate 100 from the second electrodes 104. The intersection regions 106 are formed by the projection of the first electrodes 102 and the second electrodes 104 onto the substrate 100. The sensor units 108 are electrically connected to each of the first electrodes 102 and each of the second electrodes 104 respectively. As shown in FIG. 2, the first electrodes 102, the insulating layer 103, the second electrodes 104, and the contact layer 110 are sequentially formed on the substrate 100 along a third direction D3. The material and the manufacturing method of each of the above components are as described above, and will not be repeated here.

It should be noted that, in the choice of the material of each component of the invention, the materials with flexibility and transparency can be chosen, so that the application range can be extended.

In the following embodiments, the same or similar elements, components, and layers are represented by similar element symbols. For instance, the insulating layer 103 in FIG. 1E, an insulating layer 103a in FIG. 3, and an insulating layer 103b in FIG. 5 are the same or similar components, and will not be repeated here.

Figure 3:
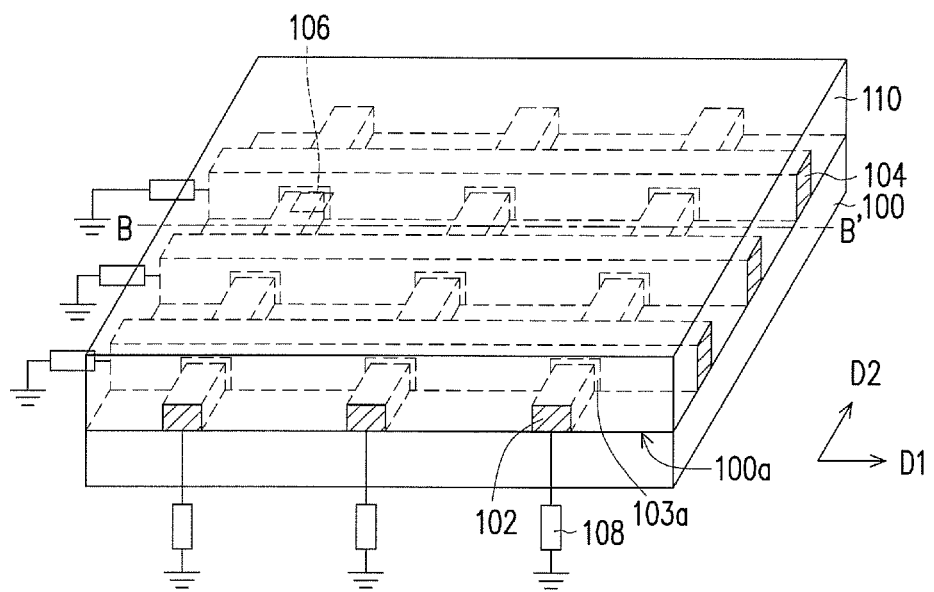
FIG. 3 is a schematic three-dimensional structure illustrating a sensor device according to another embodiment of the invention.
Figure 4:
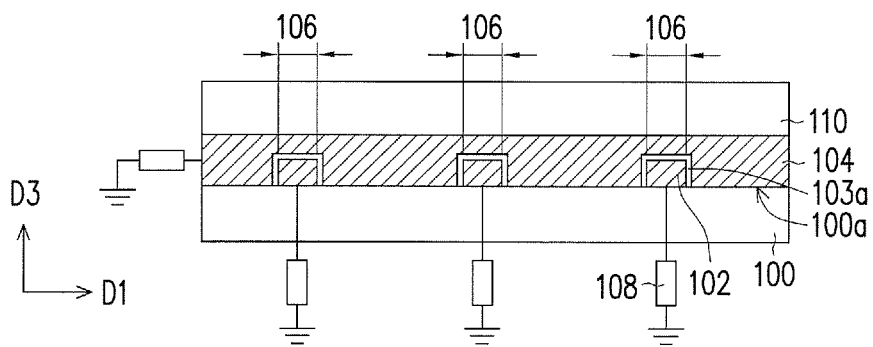
FIG. 4 is a schematic cross-sectional diagram illustrating the sensor device along the line B-B' of FIG. 3.

FIG. 3 is a schematic three-dimensional structure illustrating a sensor device according to another embodiment of the invention. FIG. 4 is a schematic cross-sectional diagram illustrating the sensor device along the line B-B' of FIG. 3.

Basically, the sensor device in FIG. 3 is similar to the sensor device in FIG. 1E. The difference between the above two is that: the insulating layer 103a in FIG. 3 is only located between the first electrodes 102 and the second electrodes 104. Specifically, in the present embodiment, after forming the insulating layer 103 covering the first electrodes 102 and the substrate 100 and before forming the second electrodes 104, the insulating layer 103 which is not located between the first electrodes 102 and the second electrodes 104 is removed. Therefore, the remaining insulating layer 103a is only located between the first electrodes 102 and the second electrodes 104. In other words, in the present embodiment, the insulating layer 103a is only located at the overlap or the intersection of the first electrodes 102 and the second electrodes 104. The first electrodes 102 and the second electrodes 104 can be electrically isolated by the insulating layer 103a.

Figure 5:
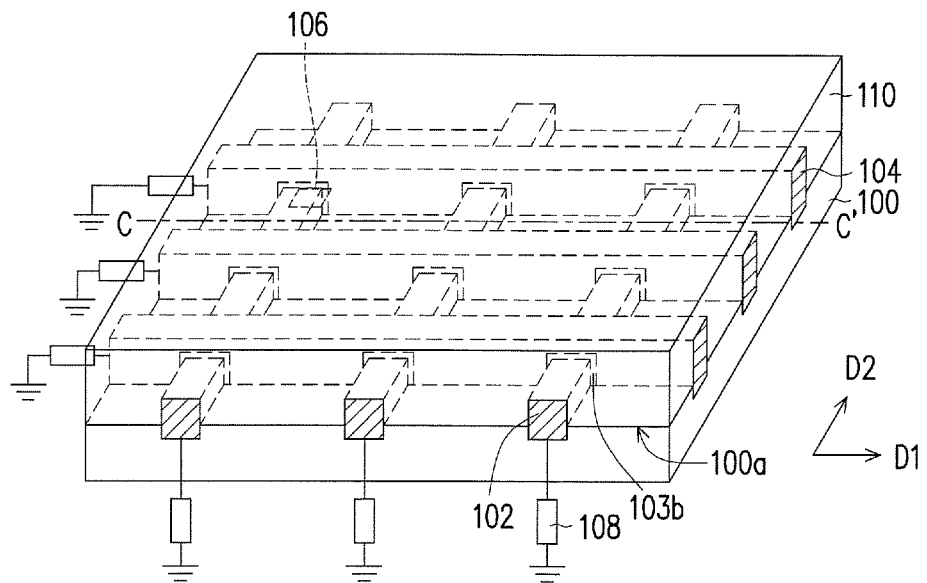
FIG. 5 is a schematic three-dimensional structure illustrating a sensor device according to yet another embodiment of the invention.
Figure 6:
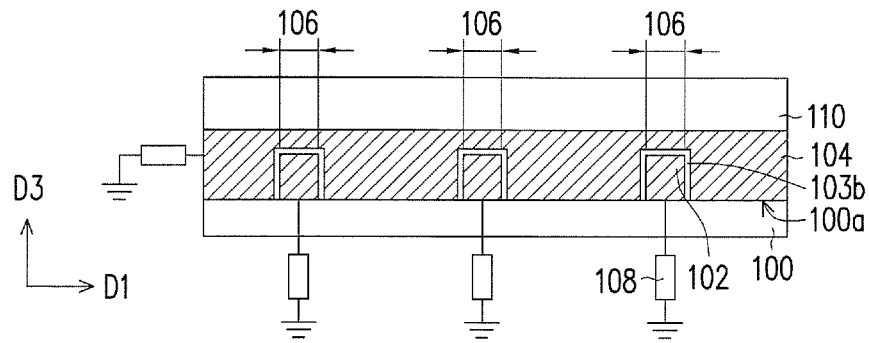
FIG. 6 is a schematic cross-sectional diagram illustrating the sensor device along the line C-C' of FIG. 5.

FIG. 5 is a schematic three-dimensional structure illustrating a sensor device according to yet another embodiment of the invention. FIG. 6 is a schematic cross-sectional diagram illustrating the sensor device along the line C-C' of FIG. 5.

Basically, the sensor device in FIG. 5 is similar to the sensor device in FIG. 3. The difference between the above two is that: a height of the first electrodes 102 in FIG. 5 is higher than a height of the first electrodes 102 in FIG. 3; a height of the second electrodes 104 in FIG. 5 is higher than a height of the second electrodes 104 in FIG. 3. Specifically, before the first electrodes 102 and the second electrodes 104 located on at least one of surfaces of the substrate 100 are formed, a patterning process is performed to form a plurality of trenches (not shown) in the substrate 100. The arrangement of the trenches is a mesh shape or a lattice shape, for example. Then, the first electrodes 102 and the second electrodes 104 are formed to fill the trenches. Therefore, in a front-face direction of FIG. 5, a bottom surface of the first electrodes 102 is lower than the upper surface 100a of the substrate 100. That is, the upper surface 100a of the substrate 100 has an uneven surface. Similarly, in a side-face direction of FIG. 5, a bottom surface of the second electrodes 104 is also lower than the upper surface 100a of the substrate 100. In the present embodiment, by etching to form the trenches in the substrate 100, the heights of the first electrodes 102 and the second electrodes 104 subsequently formed can be increased, so as to increase the surface area ratio of the first electrodes 102 and the second electrodes 104. Thereby, the quantity of the induced charge can be increased. Additionally, in the present embodiment, as shown in FIG. 6, the insulating layer 103b is only located at the overlap or the intersection between the first electrodes 102 and the second electrodes 104, so as to electrically isolate the first electrodes 102 from the second electrodes 104. However, the present invention is not limited thereto. In other embodiments, the insulating layer (not shown) may be blanketly formed between the first electrodes 102 and the second electrodes 104 and between the second electrodes 104 and the substrate 100.

Figure 7:
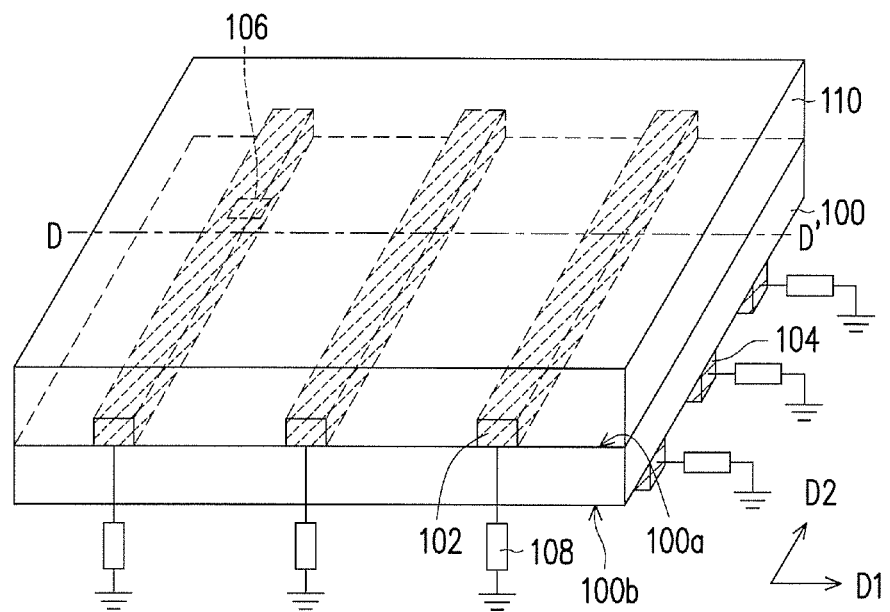
FIG. 7 is a schematic three-dimensional structure illustrating a sensor device according to yet another embodiment of the invention.
Figure 8:
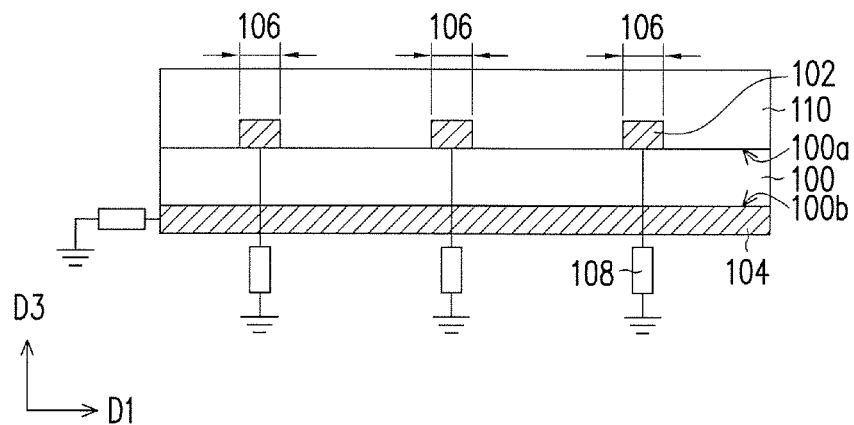
FIG. 8 is a schematic cross-sectional diagram illustrating the sensor device along the line D-D' of FIG. 7.

FIG. 7 is a schematic three-dimensional structure illustrating a sensor device according to yet another embodiment of the invention. FIG. 8 is a schematic cross-sectional diagram illustrating the sensor device along the line D-D' of FIG. 7.

Basically, the sensor device in FIG. 7 is similar to the sensor device in FIG. 1E. The difference between the above two is that: the first electrodes 102 and the second electrodes 104 are respectively located on different surfaces of the substrate 100 in FIG. 7. Specifically, as shown in FIG. 7 and FIG. 8, the first electrodes 102 are located on the upper surface 100a of the substrate 100, for example, and the second electrodes 104 are located on the bottom surface 100*b* of the substrate 100, for example. In the present embodiment, since the first electrodes 102 and the second electrodes 104 are separated by the substrate 100, forming the additional insulating layer 103 located between the first electrodes 102 and the second electrodes 104 is not required. However, the present invention is not limited thereto. The material and the manufacturing method of other components in the present embodiment are the same as FIG. 1A to FIG. 1E and FIG. 2, and will not be repeated here.

FIG. 9A to FIG. 9E are charge induction principle diagrams illustrating the sensor device according to FIG. 2.

The operation principle of the sensor device of the invention is illustrated by the schematic cross-sectional diagrams of the sensor device from FIG. 9A to FIG. 9E.

Figure 9A:
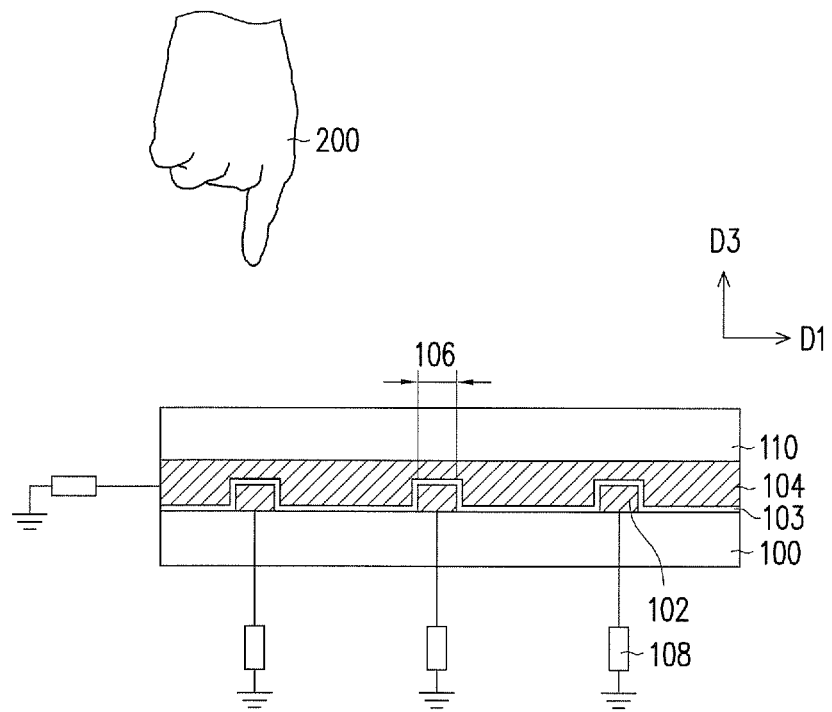
FIG. 9A to FIG. 9E are charge induction principle diagrams illustrating the sensor device according to FIG. 2.
Figure 9B:
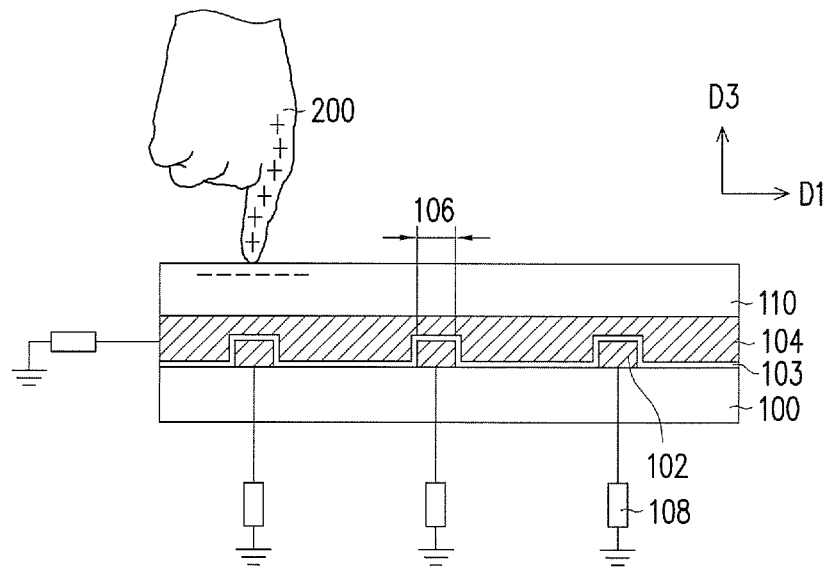
Figure 9C:
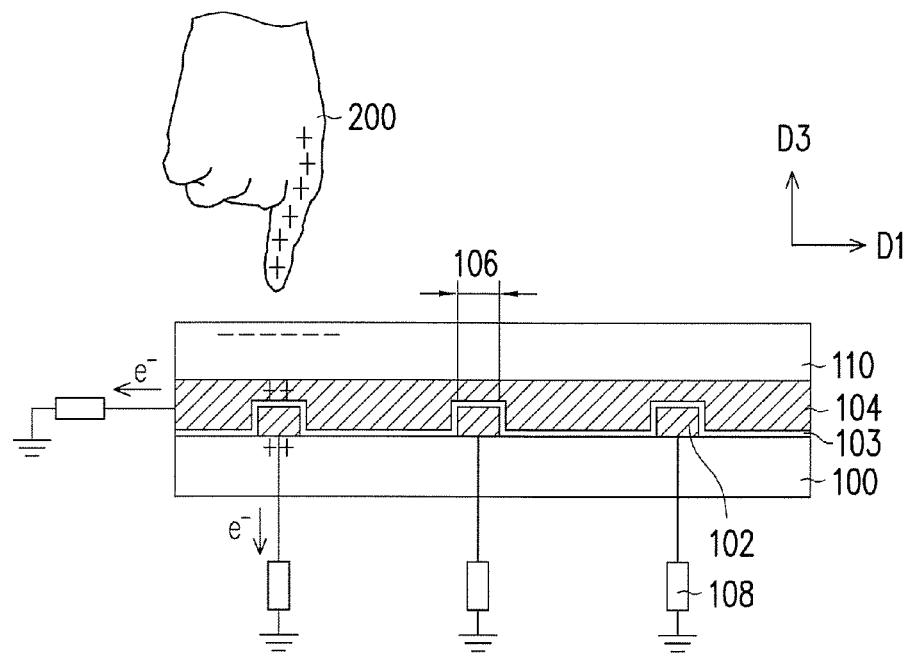
Figure 9D:
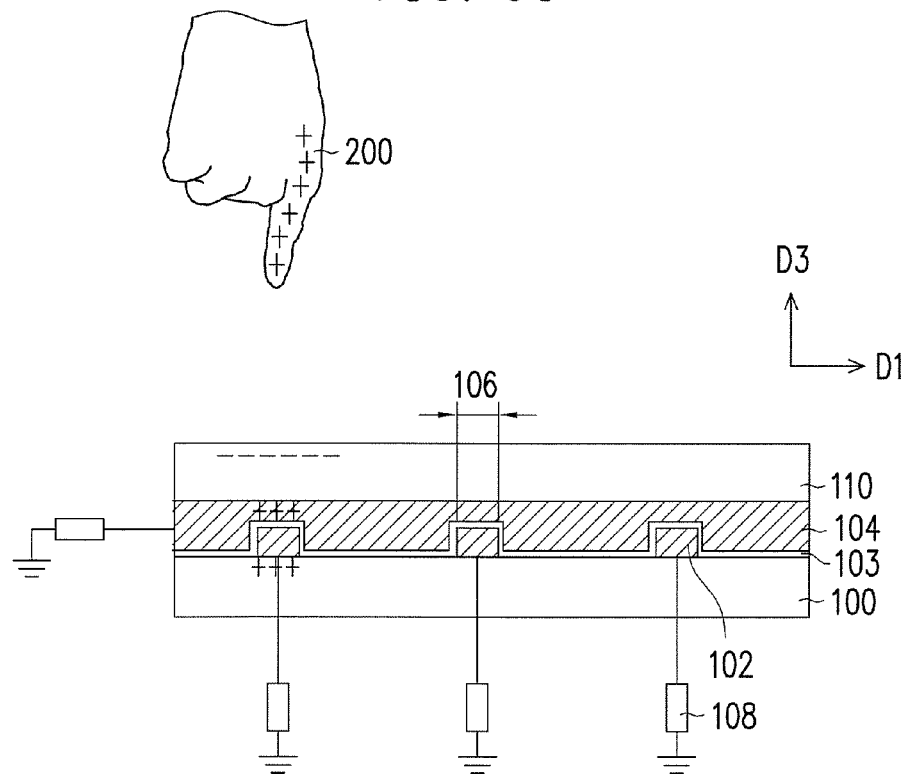
Figure 9E:
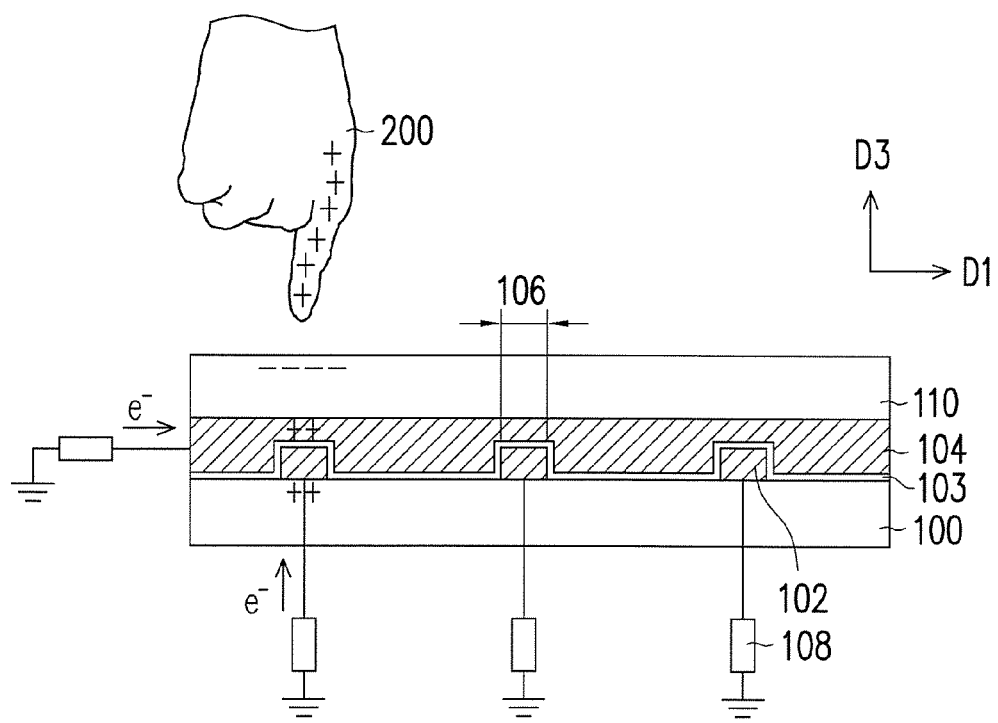

In an embodiment, an object 200 having higher positive electricity compared to the contact layer 110 is provided. For instance, the contact layer 110 is for example, PDMS, and the object 200 is for example, a finger. However, the present invention is not limited thereto, as long as the material having higher positive electricity compared to that of the contact layer 110 can be used as the material of the object 200. As shown in FIG. 9A, when the object 200 is not in contact with or close to the sensor device, the induced charge is not generated. Next, as shown in FIG. 9B, the object 200 is in contact with the contact layer 110 of the sensor device. The contact region of the object 200 and the contact layer 110 is located at one of the intersection regions 106 formed by the projection of the first electrodes 102 and the second electrodes 104 onto the substrate 100. Since the object 200 has higher positive electricity compared to the contact layer 110, the negative charge may be induced to generate on the contact surface of the contact layer 110 and the object 200. Subsequently, as shown in FIG. 9C, at the moment that the object 200 having positive electricity is moved away from the surface of the contact layer 110, since the contact surface of the contact layer 110 and the object 200 is still in a negative charge state, the first electrodes 102 and the second electrodes 104 generate the induced positive charge. That is, electrons may flow through the sensor units 108 from the first electrodes 102 and the second electrodes 104 to the ground, so that the first electrodes 102 and the second electrodes 104 gradually generate the positive charge. Next, as shown in FIG. 9D, when the object 200 is moved away from the contact layer 110 completely, the output of electrons may achieve the maximum value, and at the same time, the sensor device can be considered that the charge balance thereof is in the electrical neutral state. Subsequently, as shown in FIG. 9E, if the object 200 having positive electricity is once again moved close to the contact layer 110, the negative charge may be induced on the surface which the contact layer 110 is moved close to the object 200, and the positive charge may be induced on the first electrodes 102 and the second electrodes 104 again. At this time, electrons may flow from the ground back to the first electrodes 102 and the second electrodes 104 to balance the induced positive charge, so as to maintain the object 200 and the contact layer 110 in the electrical neutral state.

Additionally, as shown in FIG. 1E and FIG. 9A to FIG. 9E, since the sensor device of the present embodiment has the first electrodes 102 and the second electrodes 104 in the mesh-shaped or lattice-shaped arrangement, the sensor device of the present embodiment can achieve the effect of positioning the object 200 by the staggered arrangement of the first electrodes 102 (e.g., in the X direction) and the second electrodes 104 (e.g., in the Y direction).

In another embodiment, an object having higher negative electricity compared to the contact layer 110 is provided. For instance, the contact layer 110 is for example, PDMS, and the object is for example, teflon. However, the present invention is not limited thereto, as long as the material having higher negative electricity compared to that of the contact layer 110 can be used as the material of the object. The object is in contact with, moved away, and then again moved close to the contact layer 110 following the above method to generate the induced charge. In the present embodiment, since the object has higher negative electricity compared to the contact layer 110, the method of generating the induced charge thereof is contrary to that of the object 200 having higher positive electricity compared to the contact layer 110 as described above.

It should be noted that, the material of the object and the material of the contact layer are not specifically limited, as long as the materials of the object and the contact layer have a relative potential difference therebetween. For example, the following materials having electricity from positive to negative listed in sequence are such as, skin, glass, nylon, wool, lead, cotton, aluminum, paper, steel, gelatin, nickel and copper, gold and platinum, natural rubber, sulfur, acetate, polyester, celluloid, urethane, polyethylene, vinyl, silicon, and teflon. That is, the materials of the object and the contact layer may be selected from the materials listed above, as long as the two materials have a relative potential difference therebetween. However, the present invention is not limited thereto.

As shown in FIG. 9A to FIG. 9E, in the process that the object is in contact with, moved away, completely moved away, and then again moved close to the contact layer 110, the performance of the output or input of current or voltage between the first electrodes 102 and the second electrodes 104 can be measured by the sensor units 108 of the invention. In other words, the sensor device of the invention can achieve the touch effect only by the contact layer 110 with a single-layer configuration. The overall thickness of the sensor device of the invention is thinner compared to that of the conventional touch devices or touch keyboards.

Additionally, the intersection regions can be formed by the staggered arrangement of the bar-shaped electrodes in the invention. The intersection regions are in array arrangement to achieve the effect of object positioning. When the electrode density in a unit area is higher (or the intersection region density is higher), sensitivity or the positioning function of the sensor device of the invention is better.

It should be mentioned that, the size of the contact area of the object and the contact layer 110 may affect the quantity of the generated induced charge. For instance, when the object 200 is a finger, for example, the generated induced charge is increased with the increase of the number of fingers which are in contact with the contact layer 110. That is, the generated induced current is increased geometrically with the increase of the number of fingers. Additionally, the size of the force applied to the object to be in contact with the contact layer 110 may also affect the quantity of the generated induced charge. For instance, when the object 200 is a finger, for example, the generated induced charge is increased with the increase of the contact force applied to the contact layer 110 by the finger. Therefore, the induced charge received by the sensor units 108 may be different according to the number of the object 200 or the contact force between the object 200 and the contact layer 110 in the invention, so that the multi-function operation is achieved. The so-called multi-function operation may be that, for example, performing the operation to zoom in or zoom out the display using two fingers; or increasing the pressure applied by the finger to achieve the operation of dragging images. However, the present invention is not limited thereto.

The sensor device of the invention can be applied to keyboards, pulse sensors, force sensors, displacement detectors, speed sensors, touch panels, strain sensors, and other related applications. However, the invention is not limited thereto.

In summary, the sensor device of the invention can be manufactured into the sensor device having flexibility, transparency, and a thin structure by the selection of suitable materials. Additionally, since the induced current or voltage is generated by the relative potential difference between the object and the contact layer of the sensor device of the invention, the external power source is not required. Also, the thickness of the sensor device of the invention is thinner compared to that of the conventional touch devices or touch keyboards. Moreover, the arrangement of the intersection regions is formed by the arrangement of the bar-shaped electrodes of the invention, such that the density of the electrode arrangement in the unit area is higher. Therefore, the sensor device of the invention can achieve more precise sensitivity.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A sensor device, comprising:
   a substrate;
   a plurality of first electrodes and a plurality of second electrodes located on at least one of surfaces of the substrate, wherein the first electrodes are arranged along a first direction and extended along a second direction, the second electrodes are arranged along the second direction and extended along the first direction, and a plurality of intersection regions are formed by a projection of the first electrodes and the second electrodes onto the substrate;
   a plurality of sensor units electrically connected to each of the first electrodes and each of the second electrodes respectively; and
   a contact layer located on at least the first electrodes or the second electrodes, wherein the contact layer is in direct contact with the first electrodes or the second electrodes.

2. The sensor device according to claim 1, wherein a thickness of the contact layer is less than 2 mm.

3. The sensor device according to claim 1, wherein the substrate comprises a flexible substrate, a hard glass substrate, a conductive substrate, a semiconductor substrate, a ceramic substrate, a metal oxide substrate, or a combination thereof.

4. The sensor device according to claim 1, wherein each of materials of the first electrodes and the second electrodes comprises metal, an alloy, or metal oxide.

5. The sensor device according to claim 1, wherein the first electrodes and the second electrodes are located on the same surface of the substrate.

6. The sensor device according to claim 5, further comprising an insulating layer located between the first electrodes and the second electrodes.

7. The sensor device according to claim 1, wherein the substrate has a first surface and a second surface opposite to each other, the first electrodes are located on the first surface of the substrate and the second electrodes are located on the second surface of the substrate.

8. A method of fabricating a sensor device, comprising:
   providing a substrate;
   forming a plurality of first electrodes and a plurality of second electrodes located on at least one of surfaces of the substrate, wherein the first electrodes are arranged along a first direction and extended along a second direction, the second electrodes are arranged along the second direction and extended along the first direction, and a plurality of intersection regions are formed by a projection of the first electrodes and the second electrodes onto the substrate;
   providing a plurality of sensor units electrically connected to each of the first electrodes and each of the second electrodes respectively; and
   forming a contact layer located on at least the first electrodes or the second electrodes, wherein the contact layer is in direct contact with the first electrodes or the second electrodes.

9. The method of fabricating the sensor device according to claim 8, wherein a thickness of the contact layer is less than 2 mm.

10. The method of fabricating the sensor device according to claim 8, wherein the substrate comprises a flexible substrate, a hard glass substrate, a conductive substrate, a semiconductor substrate, a ceramic substrate, a metal oxide substrate, or a combination thereof.

11. The method of fabricating the sensor device according to claim 8, wherein each of materials of the first electrodes and the second electrodes comprises metal, an alloy, or metal oxide.

12. The method of fabricating the sensor device according to claim 8, wherein the first electrodes and the second electrodes are located on the same surface of the substrate.

13. The method of fabricating the sensor device according to claim 12, further comprising forming an insulating layer located between the first electrodes and the second electrodes.

14. The method of fabricating the sensor device according to claim 8, wherein the substrate has a first surface and a second surface opposite to each other, the first electrodes are located on the first surface of the substrate and the second electrodes are located on the second surface of the substrate.

15. The sensor device according to claim 1, wherein a material of the contact layer comprises polydimethylsiloxane (PDMS), polytetrafluoroethene (PTFE), silicon oxide ($SiO_2$), a metal thin film, nylon, or a combination thereof.

* * * * *